United States Patent
Mathuni

(10) Patent No.: US 8,815,746 B2
(45) Date of Patent: Aug. 26, 2014

(54) APPARATUS AND METHOD FOR PRODUCING MICROCOMPONENTS AND USE OF

(75) Inventor: Josef Mathuni, Munich (DE)

(73) Assignee: R3T GmbH Rapid Reactive Radicals Technology, Taufkirchen (DE)

( * ) Notice: Subject to any disclaimer, the term of this patent is extended or adjusted under 35 U.S.C. 154(b) by 0 days.

(21) Appl. No.: 13/599,985

(22) Filed: Aug. 30, 2012

(65) Prior Publication Data

US 2012/0325264 A1 Dec. 27, 2012

Related U.S. Application Data

(63) Continuation of application No. 12/330,028, filed on Dec. 8, 2008, now abandoned.

(30) Foreign Application Priority Data

Dec. 12, 2007 (DE) .......................... 10 2007 059 717

(51) Int. Cl.
| | |
|---|---|
| *G01L 21/30* | (2006.01) |
| *G01R 31/00* | (2006.01) |
| *H01L 21/302* | (2006.01) |
| *H01L 21/461* | (2006.01) |
| *B44C 1/22* | (2006.01) |
| *C03C 15/00* | (2006.01) |
| *C03C 25/68* | (2006.01) |
| *C23F 1/00* | (2006.01) |

(52) U.S. Cl.
USPC ................ 438/716; 216/59; 216/67; 438/727

(58) Field of Classification Search
CPC ............ H01L 21/31138; H01L 21/302; H01L 21/261
USPC .............................. 216/59, 67; 438/716, 727
See application file for complete search history.

(56) References Cited

U.S. PATENT DOCUMENTS

| 4,139,051 | A | * | 2/1979 | Jones et al. ................... 165/80.1 |
| 6,352,870 | B1 | * | 3/2002 | Lansford .......................... 438/17 |
| 7,288,484 | B1 | | 10/2007 | Goto et al. |
| 7,387,968 | B2 | | 6/2008 | Joe |
| 8,343,280 | B2 | | 1/2013 | Iimuro |
| 2005/0120956 | A1 | | 6/2005 | Suzuki |
| 2006/0275711 | A1 | * | 12/2006 | Fu et al. ......................... 430/320 |

FOREIGN PATENT DOCUMENTS

| DE | 19847848 C1 | 5/2000 |
| DE | 10121188 A1 | 4/2001 |
| WO | 2004104704 A2 | 12/2004 |
| WO | 2007056369 A2 | 5/2007 |

OTHER PUBLICATIONS

GaSonics IPC L3510 Ashing System (Wikipedia web page).*
European Search Report mailed Nov. 15, 2013 for European Patent Application No. 08020989 (Publication No. 2070869).

* cited by examiner

*Primary Examiner* — Binh X Tran
*Assistant Examiner* — Thomas Pham
(74) *Attorney, Agent, or Firm* — Baker & Hostetler LLP

(57) ABSTRACT

An apparatus and the use of such an apparatus and method for producing microcomponents with component structures are presented which are generated in a process chamber on a substrate according to the LIGA method for example and are stripped from the enclosing photoresist with the help of a cooled remote plasma source.

7 Claims, 2 Drawing Sheets

APPARATUS AND METHOD FOR PRODUCING MICROCOMPONENTS AND USE OF

This application claims priority to and is a continuation of pending U.S. patent application entitled, An Apparatus and Method for Producing Microcomponents and Use Of, filed Dec. 8, 2008, having a Ser. No. 12/330,028, the disclosure of which is hereby incorporated by reference in its entirety.

BACKGROUND OF THE INVENTION

The invention relates to an apparatus for producing microcomponents with component structures which are generated in a process chamber on a substrate according to the LIGA method. The invention further relates to a method for producing microcomponents with component structures in which the microcomponents are generated in provided substrates and thereafter are relieved from the enclosing material sections, such that the material sections can be etched away (stripped). The invention further relates to the use of such an apparatus and method for stripping or removing the material sections enclosing the microcomponents.

Apparatuses and methods of this kind with which microcomponents are produced for the clock industry are well known from the state of the art. Methods are frequently used here which are based on a combination of lithography and electroplating. These methods are generally well known as LIGA methods. In such a "LIGA" method, a photoresist can be applied at first to a substrate such as a wafer or the like. A negative resist with the designation SU-8 can be used as a photoresist.

The substrate can concern a silicon wafer for example which comprises a thin gold layer on its surface on which microcomponents can grow especially well. The photoresist is applied to this silicon wafer. It especially covers the gold layer and can be exposed there selectively by means of a suitable exposure system and a mask. The unexposed places of the photoresist layer are removed in a subsequent development step.

In a subsequent electroplating process, a metal such as nickel or gold can be allowed to grow on the thus prepared substrate surface, with the respective metal beginning to grow on the places stripped of the photoresist layer. Depending on the intended application, growth can be stopped when the grown metal structure grows slightly beyond the photoresist layer.

Photoresist SU-8 comes with the disadvantage that the removal of the cross-linked SU-8 structures between metal structures deposited by electroplating is currently very complex. SU-8 is based on epoxy resin which in the cross-linked state is very stable against organic and inorganic etchants. Photoresist is removed by means of currently known etchants either very slowly or in such a way that the metallic microcomponents are also attacked and thus become useless.

Mechanical removal of the photoresist from the microcomponent is not only laborious and cost-intensive, but also causes a high rejection rate due to the extremely small dimensions of the microcomponents. Some complex structural shapes cannot even be produced at all under these conditions.

Conventional plasma methods progress on the one hand very slowly and on the other hand the metal is attacked by ions and electrons. The etching process needs to be interrupted frequently because the substrates otherwise will become too hot.

In previous methods, the end of the stripping process, i.e. the removal of the photoresist, is determined on the basis of integral temperature measurement by means of emission spectroscopy, which entails very high costs. When photoresist is removed in an etching chamber in batch operations from several microcomponents on the respective substrates, it was only possible to date to recognize the start of the etching process by means of a rise in the integral process temperature and the global end of the etching process by means of the drop in the integral process temperature. It was not possible to individually monitor the individual substrates which may have differently thick layers of photoresist and thus require differently long stripping periods. It was further not possible to recognize in time whether an individual substrate will become too hot due to a bad contact to the substrate holder for example which rests on a work plate and will thus be damaged.

WO 2004/104704 A2 discloses a lithographic method for producing microcomponents. It is tried to form etching chambers in a constructional way, through which removal of SU-8 is facilitated. Several intermediate steps are added as a result of additional bonding layers, support structures, masks and exposure steps, through which construction and production of the microcomponents becomes more laborious.

SUMMARY OF THE INVENTION

From all the aforementioned disadvantages of the state of the art, the invention is based on the object of ensuring that the photoresist is to be stripped as easily, efficiently and reliably as possible, so that rejects are minimized.

The simplicity of production shall be achieved by utilizing and combining already existing techniques and systems with as few as possible, but effective additional steps. Efficiency of production shall be raised by the possibility of simultaneous treatment of several substrates in an etching chamber and by reducing the stripping duration through an increased removal rate of the photoresist. The reliability of the production and thus the reduction in the number of the damaged microcomponents shall be implemented with the help of individual temperature monitoring and lowering the substrate temperature and by avoiding aggressive etchants.

The object of the invention is achieved in respect of its method in such a way that the photoresist is stripped with the help of a cooled remote plasma source by chemical etching due to the increased density of the radicals, with the temperature of the microcomponents being monitored individually and the progression of the temperature being subjected to the recognition of an end point.

The use of a remote plasma source for stripping photoresist offers the advantage that no ions or electrons will reach the substrate and place a thermal load on the same. The radicals strip the photoresist through pure chemical etching. The density of radicals is increased by using a microwave source such as the one from R3T GmbH. A suitable apparatus by means of which the etching process as explained above can be performed especially well is described in the patent specification DE 198 47 848 C1. The apparatus described there comprises a generator for generating electromagnetic waves such as a microwave generator. The electromagnetic waves can be used to form excited and/or ionized particles in a plasma zone. At least the excited particles are conveyed by means of a suitable feed line to the etching chamber in order to trigger there the desired etching process on the surfaces of the substrates. Since the plasma chamber of the source is cooled with a coolant such as water, a cooled beam of radical particles of high radical density is introduced for stripping into the etching chamber, through which a high removal rate is achieved which rises with the density of the radicals on the one hand, and the thermal loading of the substrates, apart from the unavoidable reaction heat, is minimized on the other hand.

For an especially advantageous embodiment of the invention, thermal sensors are distributed over the entire work area for individually checking the local substrate temperatures. They are held in a resilient manner in the work plate, so that a mechanical and thus thermal contact is ensured with the bottom side of a substrate holder on which the substrate is located. It is understood that the substrate can also be placed directly on the work plate, and in this case the thermal sensors would have direct contact with the bottom side of the substrate. It has been seen that as a result of the temperature data measured in real time, especially on each of the substrates, it is possible to draw precise conclusions on the progress of the etching process, advantageously on each of the substrates.

The term "substrate" describes any structure which can be used as a carrier on which the microstructures can grow. Widely used as silicon wafers which can be provided with a thin gold layer, with said gold layer being used as a starting layer from which the microstructures will grow. In the present connection, the term wafer shall generally be used synonymously for the term "substrate".

"Substrate holders" shall mean such structures which can produce contact between the substrates and the work plate. A substrate is applied to their upper side by means of a contact means and the work plate is located on its bottom side. It is ensured that heat from the substrates which become hot as a result of reaction heat is forwarded via the contact means to the substrate holder and from there to the work plate. Furthermore, a substrate holder is used for horizontally planar positioning of a substrate in an etching chamber.

Any devices are suitable as a "work plate" on which the provided substrates can be arranged either with or without a substrate holder within the etching chamber. Ideally, a cooling medium flows through the work plate in order to thus enable the removal of the process heat from the etching chamber.

The term "etching chamber" describes any device in which the production of microstructures can be made. In such a chamber, a photoresist layer can be removed from a substrate surface and/or a microstructure surface for example.

The term "contact means" describes any means which is suitable of improving the contact between the provided substrates and the substrate holders, so that temperature differences between the provided substrates and the work plate can be compensated in a better way than without such contact means. It is understood that such contact means can be realized in many ways as long as an especially intimate contact is produced between the substrate and the substrate holder.

In accordance with the invention, these contact means provide a substantially better contact between the provided substrates and the substrate holders, so that critical thermal energy present in the substrates and/or the microstructures can be dissipated in a substantially better way into the work plate, thus considerably reducing a thermal loading of the substrates, and the microstructures in particular, in an advantageous manner. The likelihood is reduced or ideally excluded that the microstructures to be produced are damaged or even rendered useless as a result of critical temperature conditions.

When the contact means comprise wax, it is possible to produce a very intensive contact between the provided substrates and substrate holders by means of the wax in an especially simple constructional way. Moreover, the wax can be removed easily from the substrates or the microstructures that have grown thereon when an etching process has been completed for example and the microstructures are to be relieved of further impurities.

Wax as a contact means allows compensating in a very effective way for very small uneven portions on the bottom side of the substrate and/or the upper side of the substrate holder caused by possible production faults or undesirable particles, so that the substrate is aligned in an horizontally planar way and is thus provided with optimal contact to the substrate holder and thus to the work plate, thus producing a favorable thermal contact for heat dissipation.

It is further especially advantageous to use the individually transmitted temperature curves as evaluation criteria for individual recognition of the end points. The transmitted temperatures rise at the beginning of the stripping process from a starting temperature such as the temperature of the work plate to the respective temperature maximum as a result of reaction heat and remain stable as long as the reaction progresses. With the end of the stripping process, the temperatures start to decrease rapidly. The start, middle, end or other suitable places of the decreasing flank of the individual temperature curve is recognized as the individual end point of the stripping process.

Ideally, a monitoring device which can be a computer or the like for example and displays and monitors the temperatures individually sent by the thermal sensors signalizes the end of the stripping process either acoustically and/or visually, so that the operator optionally removes the finished stripped microcomponent from the etching chamber or waits until further microcomponents have been completely stripped.

It would also be possible to arrange the monitoring device in such a way that the stripping process is controlled automatically.

The object of the invention is achieved by means of the apparatus in such a way that a microwave source is arranged outside of the etching chamber to increase the density of the radicals.

The arrangement of a plasma chamber outside of the etching chamber is further advantageous. Ideally, said plasma chamber is cooled with a cooling medium. Water or other agents are considered as cooling medium for example which are able to dissipate heat from the plasma chamber.

A remote plasma method can preferably be used in this connection in which the plasma is generated advantageously outside of an etching chamber and ideally no ions and/or electrons reach a substrate within the etching chamber. The substrate is advantageously not additionally thermally loaded by these ions or electrons. In particular, an already cooled radical particle beam with a density of radicals can be provided favorably especially with the apparatus as described above from the patent specification DE 198 47 848 C1.

The arrangement of the spring-supported thermal sensors in the work place beneath the substrate positions is especially advantageous. The thermal sensors have contact with the bottom side of the substrate holder or with the bottom side of the substrate when no substrate holders are used. Ideally, a spring-supported thermal sensor is associated with each employed substrate or substrate holder. Individual temperature measurement and monitoring of each substrate in real time are thus ensured.

Ideally, a monitoring device will be used which will individually display the temperatures in real time determined by the thermal sensors and will monitor them by means of suitable criteria. The monitoring comprises the determination of the end points and signaling the termination of the stripping processes. It shall further be monitored whether a stripping process will run according to a predetermined scheme. If malfunctions occur such as the overheating of a substrate, the monitoring device will signalize this malfunction and will initiate suitable measures so that the substrate will not be damaged.

The arrangement of a monitoring device at a location which need not necessarily be close to the plasma chamber is further advantageous. The operator can conveniently observe the stripping process in real time from his/her office. When a completed stripping process is signalized via the monitoring device, the operator can decide whether or not this completed microcomponent is removed from the etching chamber.

As a result of the advantages explained above, the application of the described apparatus and method is well-suited for stripping photoresist for microcomponents with component structures.

BRIEF DESCRIPTION OF THE DRAWINGS

The invention is explained below in closer detail by reference to an embodiment shown in the drawings, which show schematically.

DETAILED DESCRIPTION

Figure 1:
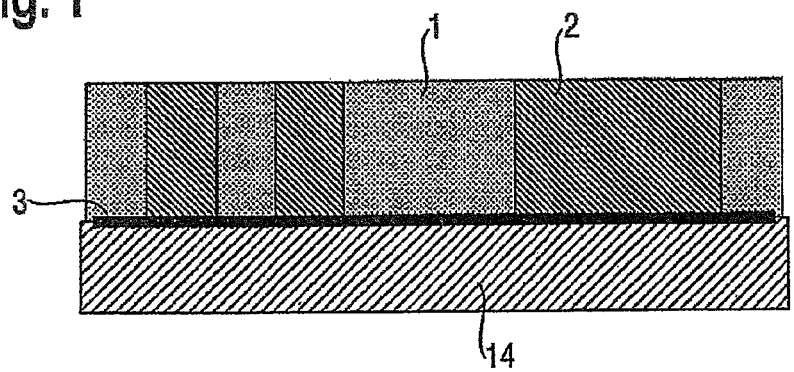
FIG. 1 shows a sectional enlarged view of a microcomponent on a substrate produced according to the LIGA method.

FIG. 1 shows a microcomponent on a substrate 14 produced according to the LIGA method. Photoresist 1 encloses the metal 2 which was electroplated to a gold layer 3 which is used as a starter layer.

Figure 2:
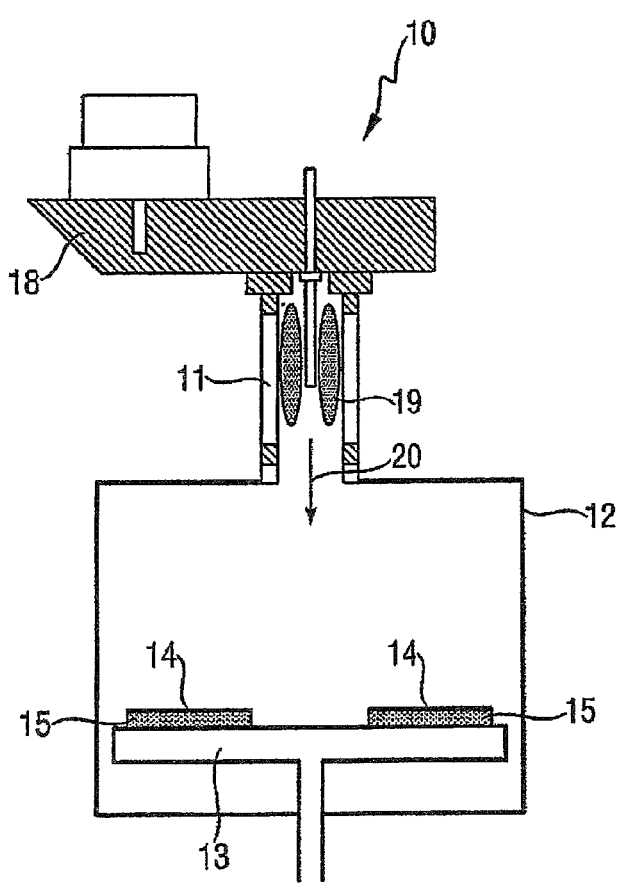
FIG. 2 shows a sectional view of an apparatus for producing microcomponents.

The apparatus 10 for producing microstructures (not shown here) as shown in FIG. 2 comprises an etching chamber 12 in which a thermostatic work plate 13 is arranged.

A microwave source 18 is arranged outside of the etching chamber 12. Furthermore, a water-cooled plasma chamber 11 is shown which is also located outside of the etching chamber 12. The microwave source 18 can be used to produce cooled remote plasma 19 in the water-cooled plasma chamber 11. A detailed description of how the present remote plasma process works in detail shall be omitted in this case because the remote plasma process concerns a well-known method. A respectively suitable apparatus and respectively suitable methods are also described in detail in the initially mentioned patent specification DE 198 47 848 C1.

In the present case, the generated remote plasma 19 is advantageously already cooled by means of the water-cooled plasma chamber 11, so that in this way an advantageous reduction in temperature can already be realized concerning the etching process yet to be explained.

The present remote plasma method can be controlled by means of the apparatus 10 shown here in such a way that a cooled radical particle beam 20 will reach the etching chamber 12 with an especially high density of radicals.

Figure 3:
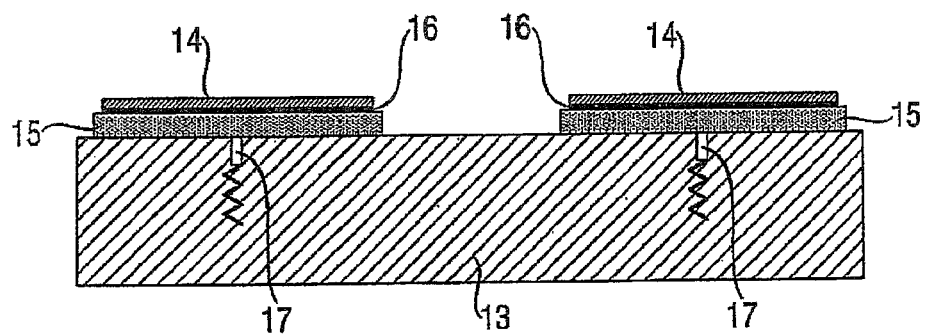
FIG. 3 shows a detailed view of the work plate of FIG. 2.
Figure 4:
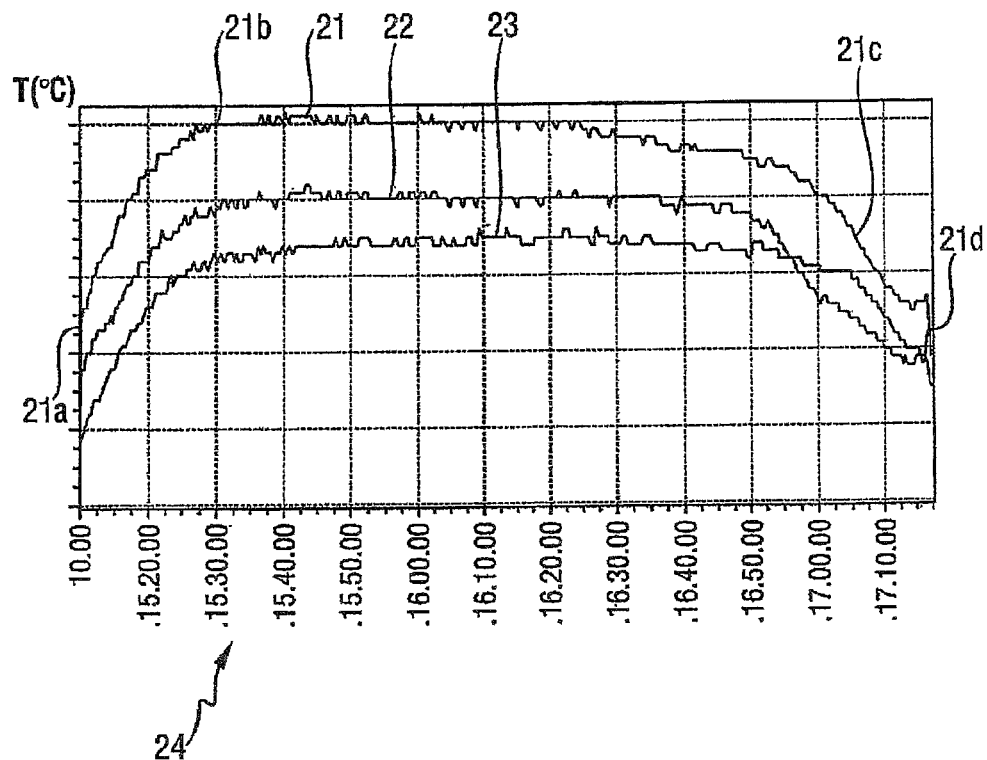
FIG. 4 shows an exemplary visualization of three temperature curves of three substrates.

As is also mainly shown in the illustration according to FIG. 3, substrates 14 are arranged on a thermostatic work plate 13. In the sectional views of this specific embodiment, two substrates 14 are placed by means of two substrate holders 15 on the work plate 13. Reaction heat which is produced during an etching process for example in which areas of material (not shown here) such as the photoresist layer SU-8 are etched away from the substrates 14 can be dissipated away from the substrates 14 in an especially advantageous manner. This dissipation of the reaction heat is achieved especially well when the two substrate holders 15 are made of thermally well-conducting material. To ensure that the heat transmission can be achieved over the full surface area from the illustrated substrates 14 to the substrate holders 15, a contact means 16 (see FIG. 3 in particular) is each arranged between the substrates 14 and the respective substrate holders 15. These layers of contact means are also used for horizontally planar positioning of the substrates 14 on the substrate holders 15 in the etching chamber 12. The contact means 16 in this embodiment is made of wax.

The wax layers are used to position the substrates 14 in a fixed but detachable way and individually above the respective substrate holders 15. Both the wax layers as well as the substrate holders 15 especially represent means within the terms of the invention for placing in a planar way the provided substrates 14 on the thermostatic work plate 13.

The wax layers ensure very advantageously that the already mentioned reaction heat is dissipated from the substrates 14 and thus also from the microstructures (not shown here explicitly) to be produced, so that especially the microstructures are also thermally loaded in a lesser way, as a result of which the rejection of microstructures can be reduced advantageously.

Moreover, spring-supported thermal sensors 17 are provided in the thermostatic work plate 13 which can be used to detect the current temperatures directly on the substrate holders 15.

This ensures advantageously to realize a monitoring of the actually existing temperatures directly on the substrate holders 15 and thus also on the substrates 14 and the respective microstructures.

A thermal sensor 17 is preferably associated with each substrate holder 15 and each substrate 14 which is arranged on the work plate 13. It can thus reliably and permanently be ensured that each of the existing thermal sensors 17 is in operative contact with the associated substrate holder 15.

When the thermal sensors 17 are held in a resilient or spring-supported manner, as shown in FIG. 3, it can be ensured especially well that the thermal sensors 17 are always pressed with sufficient force against the substrate holders 15.

Since there is a direct connection between the temperatures applied to the substrates 14 and the presence of photoresist that still needs to be etched away, it is possible to draw conclusions on the basis of the determined temperature data on how far the etching process has already progressed on one of the substrates 14, as already described above. In particular, due to a rapidly falling temperature during the etching process it is possible to recognize whether an etching process has already finished on one of the substrates 14 because no reaction heat is then produced on this substrate.

In order to enable a respective evaluation of the temperature data detected by means of the thermal sensors 17 it is advantageous when the present apparatus 10 comprises a suitable monitoring device which offers the possibility for visualizing the detected temperature data by means of display means 24.

The present example visually shows in the display means 24 a first temperature curve 21 of a substrate 14, a second temperature curve 22 of another substrate 14 and a third temperature curve 23 of a third substrate (not shown here).

The temperature curves 21, 22 and 23 show the respective temperatures on the respective substrates 14 over a specific period of time. It is described on the basis of the first temperature curve 21 in which phase the first substrate 14 is located. At the beginning of the etching process, the substrate 14 on which the first spring-supported thermal sensor 17 is arranged has an initial temperature 21a which is close to the temperature of the thermostatic work plate. With the start of the stripping process, the temperature on the substrate 14 rises to an equilibrium temperature 21b. The equilibrium temperature will occur when the temperature gradient occurring towards the work plate 13 is dissipating the reaction heat from the substrate 14. The equilibrium temperature remains virtually constant as long as the stripping process occurs in this substrate 14. Once the substrate 14 has been stripped of photoresist, the temperature will start to drop. The start, middle, end or other suitable places of the decreasing flank of the temperature curve can be recognized as the end point of the stripping process 21c. The possibility for setting an optimal etching duration is given by suitable setting of the end point recognition.

The present apparatus can be used to display different temperatures and different temperature curves 21, 22, 23 in connection with each of the substrates 14, so that an evaluation of the respectively occurring etching process on the respective substrate 14 can be made rapidly and securely. Reasons for the different temperature curves can be differently running reactions on the respective substrate 14 which may indicate differently thick layers of resist.

What is claimed is:

1. A method for producing microcomponents with component structures which are produced on a substrate by using the LIGA method, with the microcomponents being stripped in an etching chamber from photoresist based on epoxy resin, wherein the photoresist is stripped in a controlled manner with a cooled remote plasma source by chemical etching through radicals, with the temperatures of the microcomponents being monitored individually with thermal sensors which are retained in a resilient manner in a thermostatic work plate, so that a mechanical and thermal contact is maintained with a bottom side of a substrate holder on which the substrate is located and respective temperature curves being subjected to an individual recognition of an end point of etching.

2. A method according to claim 1, wherein the individual monitoring of the temperatures of the microcomponents is made in real time.

3. A method according to claim 1, wherein the substrate is pressed in a planar manner with the help of a contact means against the substrate holder which rests in a planar way on the thermostatic work plate (3) and is severed again after the end of the stripping process, through which reaction heat is dissipated during the stripping process from the substrate to the substrate holder and from there via its bottom side to the thermostatic work plate, so that the substrate is not damaged as a result of the thermal and mechanical loading.

4. A method according to claim 1, wherein the temperature curves are used as evaluation criteria for individually recognizing the end point of etching, with the temperature rising with the start of the stripping process from an initial temperature as a result of reaction heat following the reaction of the photoresist with the radicals to an equilibrium temperature and remaining stable as long as the reaction occurs and decreasing with the end of the stripping process to an end temperature, through which the recognition of the end point is linked to the decreasing flank of the temperature curve.

5. A method according to claim 1, wherein the density of the radicals in the plasma is increased with the help of an external microwave source.

6. A method according to claim 1, wherein an external plasma chamber for providing a remote plasma is cooled with a coolant for the benefit of lower thermal loading of the microcomponents disposed in an etching chamber through which the microcomponents already stripped of photoresist can remain in the etching chamber until the end of all stripping processes is recognized on the basis of the temperature curves and the etching process is thus terminated in due time.

7. A method according to claim 1, wherein the individual end point recognition signalizes the end of each stripping process via a display of a monitoring device, so that the respectively finished stripped microcomponent can optionally be removed from the etching chamber.

* * * * *